United States Patent [19]
Ikeda

[11] Patent Number: 4,542,484
[45] Date of Patent: Sep. 17, 1985

[54] SENSE AMPLIFIER WITH HIGH SPEED, STABILIZED READ-OUT

[75] Inventor: Hiroaki Ikeda, Tokyo, Japan

[73] Assignee: Nippon Electric Co., Ltd., Tokyo, Japan

[21] Appl. No.: 405,462

[22] Filed: Aug. 5, 1982

[30] Foreign Application Priority Data

Aug. 5, 1981 [JP] Japan .................. 56-123261

[51] Int. Cl.[4] ................. G11C 7/00; G11C 11/40
[52] U.S. Cl. ................... 365/205; 365/207; 365/208; 365/154
[58] Field of Search ............ 365/154, 205, 207, 208, 365/156, 206

[56] References Cited

U.S. PATENT DOCUMENTS

| | | | |
|---|---|---|---|
| 3,600,609 | 8/1971 | Christensen | 365/205 |
| 4,061,999 | 12/1977 | Proebsting et al. | 365/205 |
| 4,413,330 | 11/1983 | Chao et al. | 365/205 |
| 4,451,906 | 5/1984 | Ikeda | 365/208 |

FOREIGN PATENT DOCUMENTS

| | | | |
|---|---|---|---|
| 0057921 | 10/1979 | Japan | 365/205 |
| 0038611 | 3/1980 | Japan | 365/205 |

OTHER PUBLICATIONS

Anderson, "Sense Latch with Adjusting Series Impedance," IBM Technical Disclosure Bulletin, vol. 22, No. 11, Apr. 1980, pp. 4861–4862.

Primary Examiner—Stuart N. Hecker
Assistant Examiner—Glenn A. Gossage
Attorney, Agent, or Firm—Sughrue, Mion, Zinn, Macpeak, and Seas

[57] ABSTRACT

A memory device which has highly stabilized read-out characteristics and is suitable to a highly integrated structure is disclosed.

The memory device comprises a flip-flop having first and second enhancement type field effect transistors which are cross-connected at first and second junction points, and third and fourth depletion type field effect transistors connected between said flip-flop and a pair of first and second bit lines and having their gates connected to a common third junction point of said flip-flop.

10 Claims, 7 Drawing Figures

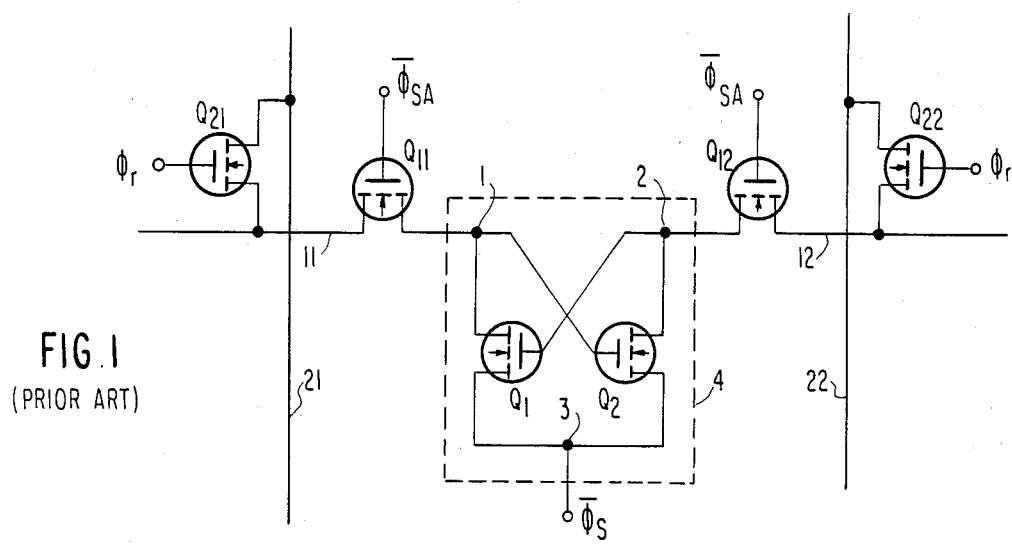
FIG. 1 (PRIOR ART)
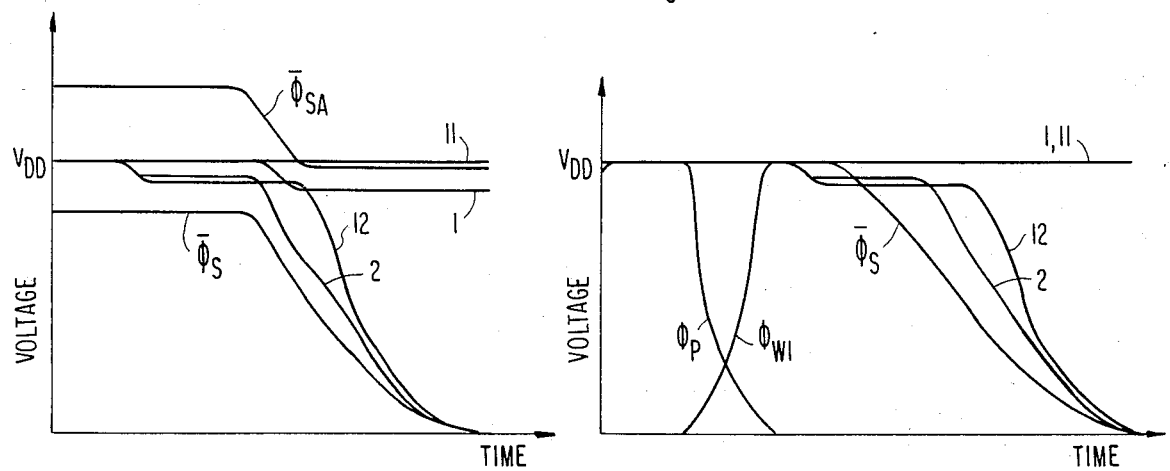
FIG. 2 (PRIOR ART)
FIG. 4
FIG. 3
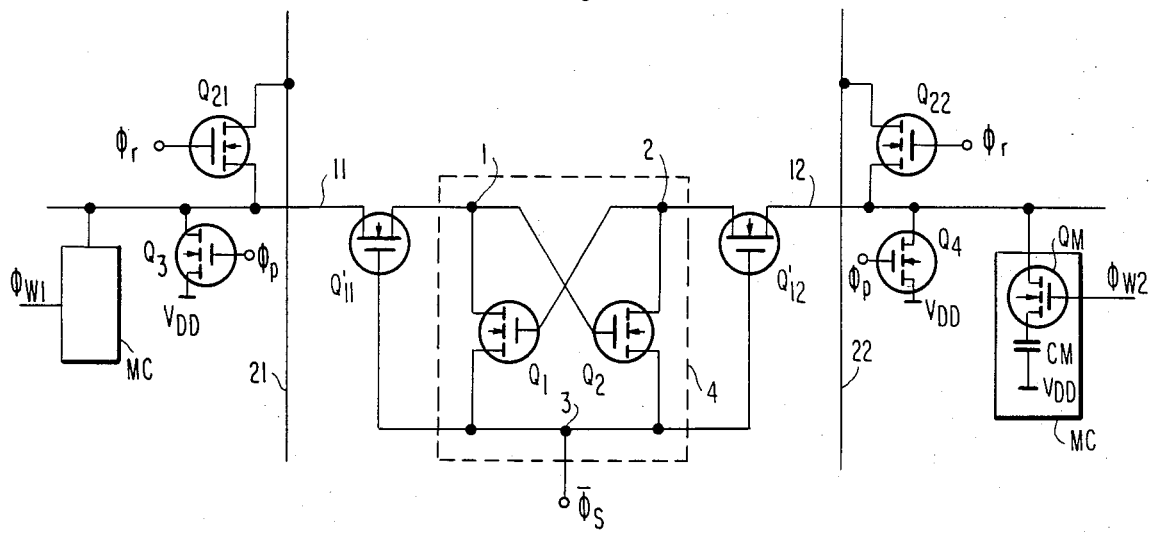

SENSE AMPLIFIER WITH HIGH SPEED, STABILIZED READ-OUT

BACKGROUND OF THE INVENTION

The present invention relates to a memory device, and more particularly to a sense amplifier for a dynamic type memory device making use of field effect transistors (hereinafter called FET's).

Recent developments towards large memory capacity and high speed operation in dynamic memories making use of MOS FET's, are remarkable, and dynamic memories having a memory capacity per chip of (64 to 256)K bits and an access time of (100 to 200) ns have been developed and subjected to practical use.

However, the problem of realizing large memory capacity and high speed operation has not been fully solved and there still remain unsolved many problems. An important one of these problems relates to a sense amplifier. The problem is such that as a result of realization of large memory capacity, stray capacitances and resistances associated with bit lines connected to a sense amplifier within the MOS dynamic memory are increased and hence amplification speed of the sense amplifier for a difference signal is lowered. Furthermore, due to the recent tendency of lowering the power supply voltage from 12 V to 5 V the difference signal based on a read signal from a memory cell which is to be determined by the sense amplifier has become small, the time required for amplifying the difference signal has become large, thereby making realization of high speed operation more difficult.

Now a sense amplifier is required to sense a difference signal appearing between bit lines at a high sensitivity and to quickly amplify the difference signal. In order to improve the amplification speed it is necessary to either enhance a capability of the transistors used in a flip-flop which is a major part of the sense amplifier or reduce the capacitance and time constant at the nodes of the sense amplifier on which the signal to be amplified is present. However, the former technique of simply enhancing a transistor capability is associated with an increase of the area of the transistor, and hence, it is contrary to realization of high integration density. In addition, as a result of the increase of the transistor area, the capacitance and time constant of the nodes would be increased. Therefore, the former technique cannot be employed in practice.

Hence, the latter technique of reducing capacitance and time constant of the nodes has been investigated as the preferred alternative approach. From the above-mentioned view point, a memory device having transfer gates interposed between the bit lines and the sense amplifier was proposed in U.S. Pat. No. 4,061,999 of Proebsting et al. According to the proposed technique, by making the transfer gates interposed between the bit lines and the sense amplifier as resistors having a high resistance during the period of amplification operation, the capacitances of the sense amplifiers appear small as viewed from the sense amplifier during the amplification operation period. Thereby the sense amplifier is enabled to achieve a high speed amplification operation substantially without being influenced by the capacitance of the bit lines. However, these transfer gates must hold the bit lines and the input/output points of the sense amplifier at the same potential by conducting in an unsaturated region during a precharge period. In this case, from the view point that a highly sensitive operation is realized by effectively utilizing the power supply voltage, the power supply voltage itself is used as a precharge voltage. Consequently, for the purpose of making the transfer gates conduct in the unsaturated region, a voltage at a higher level than the power supply voltage is necessitated as a driving voltage for the transfer gates, and this voltage must be maintained during the precharge period. To that end, in the heretofore known memory, special circuit means for generating a voltage higher than the power supply voltage was necessitated and it served as an obstacle against realization of a high integration density. Moreover, it is difficult to maintain such a voltage higher than the power supply voltage at a stable potential over the precharge period, and therefore, there was a shortcoming that the sensitivity of the sense amplifier would fluctuate for the respective operations.

SUMMARY OF THE INVENTION

One object of the present invention is to provide a memory device which is capable of highly speeded up and highly stablized operation without necessitating the use of a signal at a special level.

Another object of the present invention is to provide a memory device having high density structure.

A memory device according to the present invention is constructed in such manner that it comprises a flip-flop consisting of first and second insulated gate field effect transistors of the enhancement type which are cross-connected at first and second junction points, and third and fourth insulated gate field effect transistors of the depletion type connected respectively between the first and second junction points and first and second bit lines, respectively.

According to the present invention, the gates of the above-referred third and fourth transistors are applied with a driving voltage at the power supply voltage level during the precharge period and has a level lower than the power supply voltage but higher than a threshold value of the third and fourth transistors during the amplification period. As such a driving voltage, for instance, a latch control signal applied to the commonly connected sources of the above-referred first and second transistors could be employed in itself.

It is desirable that the first and second transistors of the enhancement type to be used according to the present invention have a threshold value of 0.2 to 1 V, in the case of an N-channel type, for the purpose of achieving a required logic operation. On the other hand, it is desirable that the third and fourth transistors of the depletion type to be used according to the present invention have a threshold value of $-0.2$ to $-1$ V, in the case of an N-channel type. The reason for this is if the threshold value is higher than $-0.2$ V, the transistors cannot sufficiently conduct during the precharge period and hence the first and second junction points cannot be precharged up to the same potential as the bit lines. In addition, if the threshold value of the third and fourth transistors is lower than $-1$ V, then the transistors cannot maintain a high resistance state during the amplification period and hence a high speed operation cannot be achieved. It is to be noted that in the case of P-channel type transistors, the preferable ranges of the threshold values are similarly defined by merely reversing the polarities of the above-referred upper and lower limit voltages.

According to the present invention, owing to the fact that the third and fourth transistors for connecting the bit lines to the input/output points of the flip-flop forming the sense amplifier are of the depletion type, a memory device having a high density integrated structure can be obtained without necessitating a special power supply circuit. Moreover, since the memory device does not make use of an unstable potential higher than the power supply voltage, it can realize a stable amplification operation.

According to one aspect of the present invention, there is provided a memory device comprising a plurality of memory cells arrayed in rows and columns, a sense amplifier for each column, a first bit line and a second bit line for each sense amplifier. The memory cells in each column being connected to at least one of the respective bit lines when the respective memory cells are enabled by a row enable signal sense amplifier having first and second input nodes, each having a relatively small capacitance value when compared to the capacitance value of the respective first and second bit lines. Each amplifier includes a first effect transistor connecting the first input node to a latch node and a second field effect transistor connecting the second input node to the latch node. The gate of the first transistor is connected to the second input node and the gate of the second transistor is connected to the first input node. First impedance means includes a third field effect transistor of a depletion type connects the first bit line to the first input node, second impedance means including a fourth field effect transistor of the depletion type connects the second bit line to the second input node. Latch node control means is provided for maintaing a precharge on the latch node and then discharging the precharge on the latch node. Bit line precharge means is provided for precharging the bit lines such that substantially the same precharge voltage level is on both first and second bit lines. Control circuit means is provided for sequentially charging the gates of said third and fourth transistors with a potential having substantially the same value as the charged potential on the first and second bit lines during at least a part of period from prosecution of the precharge on the first and the second bit lines to initiation of discharge on the latch node and then discharging the gates of the third and fourth transistors after the initiation of discharge on the latch node.

BRIEF DESCRIPTION OF THE DRAWINGS

Other features and advantages of the present invention will become apparent upon a perusal of the following specification taken in conjunction with the accompanying drawings.

FIG. 1 is a circuit diagram showing one example of a memory device in the prior art;

FIG. 2 is an operation waveform diagram showing potentials at various points and signal voltages in the circuit shown in FIG. 1;

FIG. 3 is a circuit diagram showing a memory device according to one preferred embodiment of the present invention;

FIG. 4 is an operation waveform diagram showing potentials at various points and signal voltages in the circuit shown in FIG. 3;

DETAILED DESCRIPTION OF THE INVENTION

Figure 5:
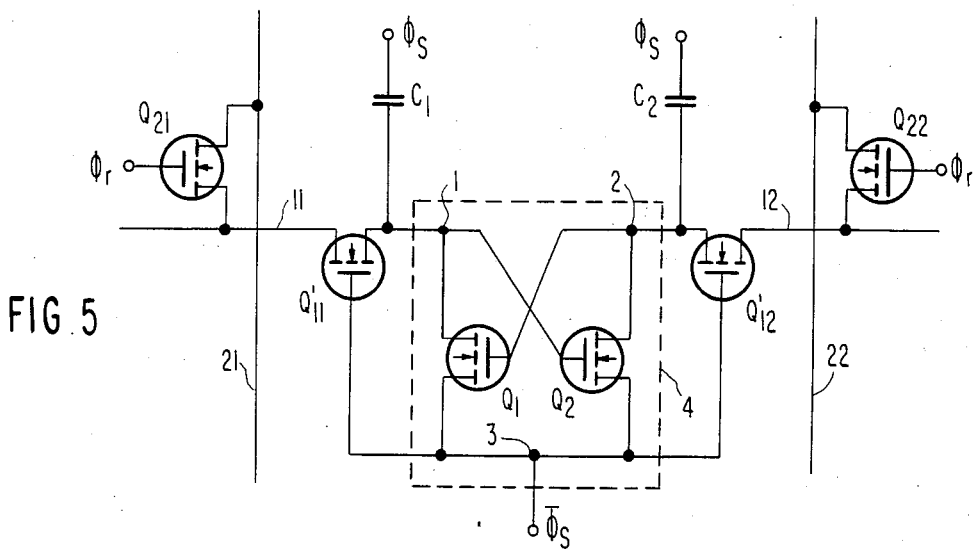
FIG. 5 is a circuit diagram showing a memory device according to another preferred embodiment of the present invention.

In the following, description will be made in connection to the case where as the insulated gate field effect transistors, MOS FET's of N-channel type are used and positive logic is employed. However, the present invention should not be limited to such particular case, but it is equally applicable to the case where insulated gate field effect transistors of P-channel type are used or to the case where negative logic is employed.

First, a memory device in the prior art will be described with reference to FIGS. 1 and 2.

A circuit diagram of a memory device in the prior art which includes a sense amplifier having transfer gates, is shown in FIG. 1. This circuit is entirely composed of enhancement type N-channel MOS FET's having the same threshold voltage. FET's $Q_1$ and $Q_2$ form a flip-flop 4 serving as a principal part of a sense amplifier. Enhancement type FET's $Q_{11}$ and $Q_{12}$ are transfer gates. To the gates of the FET's $Q_{11}$ and $Q_{12}$ is applied a signal $\phi_{SA}$. The drain of the FET $Q_{11}$ is connected to a node 1 of the flip-flop 4 and its source is connected to a bit line 11. Likewise, the drain of the FET $Q_{12}$ is connected to a node 2 of the flip-flop 4 and its source is connected to a bit line 12. To a common source node 3 of the flip-flop 4 is applied a latch control signal $\phi_S$. The bit lines 11 and 12 are respectively connected to input /output buses 21 and 22, respectively, via selection gate FET's $Q_{21}$ and $Q_{22}$. Interchange of information with an external circuit is effected according to a bit line selection signal $\phi_r$ applied to the gates of FET's $Q_{21}$ and $Q_{22}$.

Now, the operation of the above-described circuit will be explained with reference to FIG. 2.

The bit lines 11 and 12 are precharged up to a power supply voltage $V_{DD}$ or close thereto. At this moment, the signal $\phi_{SA}$ is present so as to become higher than the power supply voltage $V_{DD}$ and the signal $\phi_S$ is also preset so as to become close to the power supply voltage $V_{DD}$. Accordingly, the FET's $Q_{11}$ and $Q_{12}$ are turned ON and hence the nodes 1 and 2 are precharged up to the same potentials as the bit lines 11 and 12, respectively. After this state has been established, a minute difference signal based on a level difference between a memory cell (not shown) and a dummy memory cell (not shown) is established between the bit lines 11 and 12. Then, the signal $\phi_{SA}$ is lowered to the proximity of the precharge level of the bit lines to turn the FET's $Q_{11}$ and $Q_{12}$ OFF. At the same time, the signal $\phi_S$ is lowered to a source power supply level $V_{SS}$. Then the sense amplifier 4 starts amplification of the difference signal. Since the FET's $Q_{11}$ and $Q_{12}$ are both held OFF at that moment, the objects of difference signal amplification to be conducted by the FET's $Q_1$ and $Q_2$ are the nodes 1 and 2 which are isolated from the bit lines 11 and 12. As the stray capacitances and resistances existing at the nodes 1 and 2 are extremely small as compared to those associated with the bit lines 11 and 12, in the initial period of the difference signal amplification it becomes possible to realize high speed amplification.

Assuming now that the node 2 is at a slightly lower potential, then the FET $Q_2$ is turned ON and in accordance with potential lowering of the signal $\phi_S$ the potential at the node 2 would fall. As the potential at the node 2 falls, the FET $Q_{12}$ is turned ON and hence the potential at the bit line 12 lowers in accordance with the potential fall at the node 2. Upon this minute difference signal amplification, it is difficult to achieve difference signal amplification while holding the FET $Q_1$ completely OFF, and normally the FET $Q_1$ becomes slightly ON, so that the potential at the node 1 falls a little simultaneously with the difference signal amplification. However, this potential fall is not enough to turn the FET $Q_{11}$ ON, and hence, the potential at the bit line 11 is maintained nearly at the precharged potential.

As a result of the series of operations, refresh of the minute difference signal and hence refresh of information relating to the selected memory cell are completed, and the amplified difference signal is carried on the bit lines 11 and 12. This information on the bit lines 11 and 12 is taken out onto the input/output buses 21 and 22 via the FET's $Q_{21}$ and $Q_{22}$ in response to the bit line selection signal $\phi_r$.

As will be obvious from the above description and a waveform diagram in FIG. 2, in the above-described memory device in the prior art, the gate signal $\phi_{SA}$ for the transfer gates $Q_{11}$ and $Q_{12}$ is required to have a level higher than the power supply voltage $V_{DD}$. If the precharge potential of the bit lines 11 and 12 is lower than the power supply voltage $V_{DD}$ to a certain extent, this requirement is not always so severe. However, at present when the power supply voltage is being transferred to a 5 V system, in order to obtain a maximum signal amplitude, the precharge potential of the bit lines has become equal to the power supply voltage $V_{DD}$. In order to obtain a sufficient sensitivity under every operating condition, the gate signal $\phi_{SA}$ must be maintained at a sufficiently higher level than the power supply voltage $V_{DD}$ upon precharging. However, the power supply voltage $V_{DD}$ itself is always varying in accordance with the operating condition of the entire memory device. Hence, it is fairly difficult to hold this higher level constant for a period of several milliseconds or more which is necessitated for precharging. Accordingly, the above-described memory device in the prior art has a disadvantage that a sensitivity characteristic of the sense amplifier is unstable without being held constant, although it achieves the object of realizing a high speed operation by enhancing a difference signal amplification speed of the sense amplifier.

In this connection, although it is possible to solve the instability of a sensitivity characteristic to a certain extent by making use of any circuit for holding the level of the gate signal $\phi_{SA}$, it would result in addition of such a surplus circuit. Hence, this solution is contrary to realization of a high integration density which is another important requirement for a memory device.

In the following, the present invention will be described in greater detail with reference to FIGS. 3 to 7 of the accompanying drawings.

A memory device according to one preferred embodiment of the present invention is illustrated in FIG. 3. It is to be noted that the corresponding component elements in FIG. 3 are given like symbols or like reference numerals in FIG. 1.

In FIG. 3, a sense amplifier comprises a flip-flop 4 consisting of first and second MOS FET's of the enhancement type $Q_1$ and $Q_2$ whose drains and gates are cross-connected at a first junction point forming a node 1 and at a second junction point forming a node 2. Between this flip-flop 4 and first and second bit lines 11 and 12 arranged symmetrically with respect to the flip-flop 4 are connected third and fourth MOS FET's of the depletion type $Q'_{11}$ and $Q'_{12}$ connected between the bit lines 11 and 12, and the nodes 1 and 2, with their source-drain paths respectively, and having their gates connected to a third common junction point which forms a node 3 of the flip-flop 4. The bit lines 11 and 12 are respectively connected to input/output buses 21 and 22 via enhancement type MOS FET's $Q_{21}$ and $Q_{22}$ which operate respectively as column selection gates. Enhancement type FET's $Q_3$ and $Q_4$ are used to precharge the bit lines 11 and 12 with the voltage $V_{DD}$ under control of a precharge signal $\phi_P$, respectively. A plurality of memory cells MC are arranged in rows and columns in a known manner and connected to the bit lines 11 and 12. Each of the memory cells MC includes a capacitor $C_M$ for storing information and a transfer FET $Q_M$ of the enhancement type connected between the associated bit line and the capacitor $C_M$. A gate of the transistor $Q_M$ is supplied with an associated one of address signal $\phi_{W1}$, $\phi_{W2}$ . . . according to its address location. The gates of the FET's $Q_{21}$ and $Q_{22}$ are applied with a column selection signal $\phi_r$ and the node 3 is applied with a latch control signal $\phi_S$. In this circuit arrangement, the threshold value of the enhancement type FET's $Q_1$, $Q_2$, $Q_3$, $Q_4$, $Q_M$, $Q_{21}$ and $Q_{22}$ is selected at 0.2 to 1 V and typically at 0.6 to 0.8 V, while the threshold value of the depletion type FET's $Q'_{11}$ and $Q'_{12}$ is selected at $-0.2$ to $-1$ V and typically at $-0.4$ to $-0.8$ V. Also, in this circuit the signal $\phi_S$ is a signal varying between a potential that is lower than the power supply voltage $V_{DD}$ by the threshold value for one stage of the transistors $Q_1$ and $Q_2$ and the ground potential. The signal $\phi_r$ is a signal varying between the power supply voltage $V_{DD}$ and the ground potential, and it is activated on the basis of column address information. Accordingly, only the signal $\phi_r$ pertinent to the pair of bit lines from which read information is to be taken out externally is selectively activated and the other signals $\phi_r$ are not activated.

As will be apparent from FIGS. 1 and 3, the difference between the circuit of the memory device according to one preferred embodiment of the present invention and the circuit of the memory device in the prior art, resides in that according to the present invention, in place of the enhancement type FET's $Q_{11}$ and $Q_{12}$ whose gates are applied with a special signal $\phi_{SA}$ in the prior art, depletion type FET's $Q'_{11}$ and $Q'_{12}$ are used as transfer gates. In addition, the gates of these FET's are connected to the node 3 of the flip-flop so that a signal $\phi_S$ may be applied in common thereto. In other words, the special signal $\phi_{SA}$ which was necessitated in the prior art and which became a cause of inducing instability, has become unnecessary, and therefore, there is provided a sense amplifier having a very stable sensitivity characteristic.

In the following, detailed description will be made on the circuit operation of the memory device according to the above-described embodiment with reference to FIG. 4.

First, the bit lines 11 and 12 are precharged up to the power supply voltage $V_{DD}$ or to a level close to that voltage $V_{DD}$ by FET's $Q_3$ and $Q_4$ in response to a high level of the signal $\phi_P$. The signal $\phi_S$ is selected so that at this moment it also takes a level close to the voltage $V_{DD}$. Then, in response to this, the gate-source potential of the depletion type FET's $Q'_{11}$ and $Q'_{12}$ becomes approximately zero which is still higher than the threshold voltage of FET's $Q'_{11}$ and $Q'_{12}$. Therefore, both FET's $Q'_{11}$ and $Q'_{12}$ are conducting and the nodes 1 and 2 are also precharged up to the same potential as the bit lines 11 and 12. After this state has been established, a minute difference signal based on a level difference between a memory cell MC and a dummy memory cell (not shown) is applied in response to one of the address signal $\phi_{W1}$ or the like between the bit lines 11 and 12. Simultaneously with application of the difference signal, the signal $\phi_S$ is lowered to the ground level. Then, the flip-flop 4 would start difference signal amplification. Under this state, the gate-source voltage $V_{GS}$ of the FET's $Q'_{11}$ and $Q'_{12}$ becomes smaller than their threshold voltage $V_{TD}$, and hence the FET's $Q'_{11}$ and $Q'_{12}$ are turned OFF. Accordingly, the objects of difference signal amplification to be conducted by the FET's $Q_1$ and $Q_2$ are only the nodes 1 and 2 which are isolated from the bit lines 11 and 12. Therefore, similarly to the memory device in the prior art as described above and illustrated in FIG. 1, high speed amplification becomes possible in the initial period of the difference signal amplification.

Assuming now that the node 2 is in a slightly lower state, then the FET $Q_2$ is turned ON, and in accordance with potential lowering of the signal $\phi_S$, the potential and the node 2 would fall. As the potential at the node 2 falls, the gate-source voltage $V_{GS}$ of the FET $Q'_{12}$ again becomes larger than the threshold value, so that the FET $Q'_{12}$ is turned ON, and in accordance with potential lowering at the node 2, the potential on the bit line 12 lowers. In this instance, since the gate potential of the FET $Q'_{11}$ lowers in accordance with the signal $\phi_S$ while maintaining the source potential at the power supply voltage $V_{DD}$ level, the gate-source voltage $V_{GS}$ of the FET $Q'_{11}$ would further become smaller than the threshold voltage $V_{TD}$, and so, the FET $Q'_{11}$ maintains its OFF state. In the above-described operation, when the signal $\phi_S$ is lowered, it is required that at first the FET $Q'_{11}$ is turned OFF and then the FET $Q_2$ is turned ON. However, by selecting the absolute value of the threshold voltage $V_{TD}$ of the FET $Q'_{11}$ smaller than the absolute value of the threshold voltage $V_T$ of the FET $Q_2$, the required operation can be surely achieved.

As a result of the series of operations, refresh of the minute difference signal and hence refresh of information are completed, and the amplified difference signal would be carried on the bit lines 11 and 12. This information on the bit lines can be taken out onto the input-/output buses 21 and 22 by making the FET's $Q_{21}$ and $Q_{22}$ conduct in response to the bit selection signal $\phi_r$ in a similar manner to that described above.

In contrast with the operation of the above-described embodiment of the present invention with that of the memory device in the prior art shown in FIG. 2 and described previously, in the preferred embodiment of the present invention, the signal $\phi_{SA}$ is not employed, and also since the FET $Q_1$ always maintains its OFF state, the potential at the node 1 can hold the level of the power supply voltage $V_{DD}$.

As described in detail above, in the memory device according to this embodiment, depletion type FET's are used in place of the enhancement type FET's which have been heretofore employed as transfer gates, and provision is made such that the property possessed by the depletion type FET's of switching ON at $V_G = 0$ V and switching OFF only after $V_G = -V_{TD}$ has been fulfilled, may be effectively utilized. Therefore, there is no need to use the signal $\phi_{SA}$ having a higher level than the $V_{DD}$ level which was necessitated in the prior art. Nevertheless, like the memory device in the prior art, the nodes 1 and 2 can be isolated from the bit lines 11 and 12, respectively, in the initial period of the difference signal amplification, and so, high speed amplification can be achieved without being influenced by the stray capacitances and resistances of the bit lines 11 and 12. Accordingly, extremely excellent stability in a sensitivity characteristic can be attained while maintaining a high speed performance of a sense amplifier which is equivalent to that in the memory device having transfer gates in the prior art.

Now, another preferred embodiment of the present invention will be described with reference to FIGS. 5 and 6.

As shown in FIG. 5, according to this preferred embodiment, in addition to the circuit arrangement shown in FIG. 3, there are provided capacitors $C_1$ and $C_2$ having their one ends connected to the nodes 1 and 2, respectively, and having a signal $\phi_S$ applied to the other ends thereof.

Figure 6:
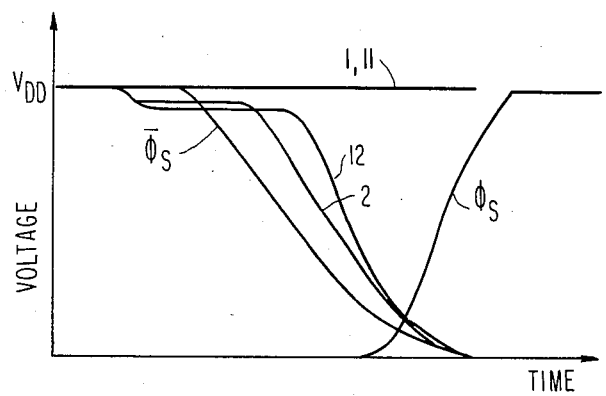
FIG. 6 is an operation waveform diagram showing potentials at various points and signal voltages in the circuit shown in FIG. 5.

As shown in FIG. 6, the signal $\phi_S$ would rise as soon as the signal $\phi_S$ has fallen, and it achieves the operation of refreshing a high level potential among the signals appearing at the nodes 1 and 2 after having been amplified. Accordingly, with such circuit arrangement, not only the lower level is refreshed, but also the higher level can be completely refreshed to its original level.

Figure 7:
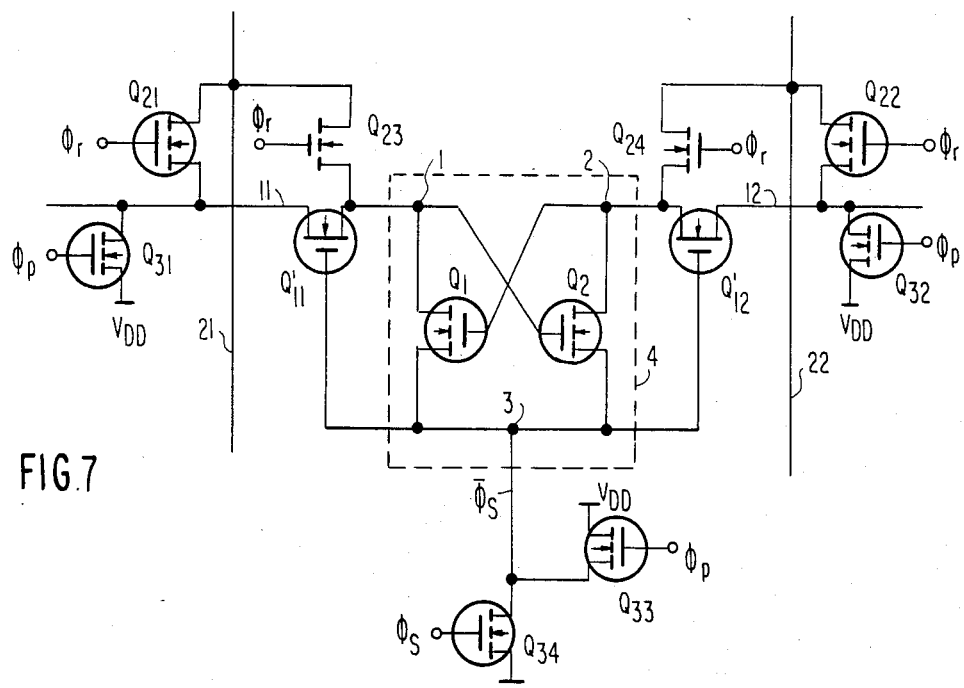
FIG. 7 is a circuit diagram showing a memory device according to still another preferred embodiment of the present invention.

Still another preferred embodiment of the present invention will be described in the following with reference to FIG. 7.

According to this preferred embodiment, modification is made such that the connection to the input/output buses 21 and 22 is effected not only through the FET's $Q_{21}$ and $Q_{22}$ connected to the bit lines 11 and 12, respectively, but also through enhancement type FET's $Q_{23}$ and $Q_{24}$ having one ends connected to the nodes 1 and 2. In other words, the input/output bus 21 is connected via the FET $Q_{21}$ to the bit line 11 and also via the FET $Q_{23}$ to the node 1. The input/output bus 22 is connected via the FET $Q_{22}$ to the bit line 12 and also via the FET $Q_{24}$ to the node 2. Owing to such circuit arrangement, upon reading, the signals amplified at a high speed and appearing at the nodes 1 and 2 can be transmitted to the input/output buses 21 and 22 via the FET's $Q_{23}$ and $Q_{24}$, respectively. Consquently, high speed reading becomes possible. This will be readily seen by recalling the fact that the potentials at the nodes 1 and 2 would change faster than the potentials on the bit lines 11 and 12. On the other hand, upon writing, write data can be transmitted at a high speed to the bit lines 11 and 12 via the FET's $Q_{21}$ and $Q_{22}$. In the above-described manner, according to this particular embodiment, high speed data access to the external circuit becomes possible.

In addition, according to this preferred embodiment, enhancement type FET's $Q_{31}$, $Q_{32}$ and $Q_{34}$ serve to precharge the bit lines 11 and 12 and the node 3, respectively, in response to a precharge signal $\phi_P$. The node 3 is grounded via another FET $Q_{34}$ which has the signal $\phi_S$ input to its gate, and so, the signal $\phi_S$ is inverted and then applied to the node 3.

While the MOS FET's were assumed to be of N-channel type in the above description, as a matter of course, the present invention is equally applicable to the case where MOS FET's of P-channel type are employed. In addition, although MOS FET's were specifically employed as the FET's in the above description, the invention is equally applicable to the case where other FET's such as MIS FET's or the like are employed.

As described in detail above, in the memory device according to the present invention, the special signal having a level higher than the power supply voltage $V_{DD}$ which was a cause of instability in the sensitivity characteristic in the prior art can be made unnecessary by making use of depletion type FET's in place of the enhancement type FET's which have been heretofore used as transfer gates. Therefore, the present invention has an advantage that there is provided a memory device having a sense amplifier of high speed and high stability. Moreover, since an associated circuit for maintaining a special signal as necessitated in the prior art also becomes unnecessary, the invention has an additional advantage that there is provided a memory device having a high integration density.

I claim:

1. A memory device comprising a first bit line, a second bit line, a first node, a second node, a third node, a first field effect transistor of an enhancement type connected between said first node and said third node with a source-drain path thereof, means for connecting a gate of said first field effect transistor to said second node, a second field effect transistor of the enhancement type connected between said second and third nodes with a source-drain path thereof, means for connecting a gate of said second field effect transistor to said first node, a third field effect transistor of a depletion type connected between said first bit line and said first node with a source-drain path and having a gate coupled to said third node, a fourth field effect transistor of the depletion type connected between said second bit line and said second node and having a gate coupled to said third node, means for operatively supplying said first and second bit lines with a precharge potential during a precharge period, and means for operatively discharging a potential at said third node during an amplification period subsequent to said precharge period, wherein the impedance of said third and fourth transistors is increased during said amplification period in response to the potential of said third node.

2. The memory device according to claim 1, further comprising a first bus line, a second bus line, a fifth field effect transistor coupled between said first bit line and said first bus line, a sixth field effect transistor coupled between said second bit line and said second bus line, and means for selectively enabling said fifth and sixth field effect transistors.

3. The memory device according to claim 1, further comprising a first capacitor connected to said first node at its one end, a second capacitor connected to said second node at its one end, and means for operatively supplying the other ends of said first and second capacitors with a refresh signal.

4. The memory device according to claim 1, in which a threshold voltage of said third and fourth field effect transistors is a value of 0.2 to 1 volt in absolute value.

5. A memory device comprising a plurality of memory cells arrayed in rows and columns, a sense amplifier for each column, a first bit line and a second bit line for each sense amplifier, the memory cells in each column being connected to at least one of the respective bit lines when the respective memory cells are enabled by a row enable signal, each sense amplifier having first and second input nodes each having a relatively small capacitance value when compared to the capacitance value of the respective first and second bit lines, each amplifier including a first field effect transistor connecting the first input node to a latch node and a second field effect transistor connecting the second input node to the latch node, the gate of the first transistor being connected to the second input node and the gate of the second transistor being connected to the first input node, first impedance means including a third field effect transistor of a depletion type connecting the first bit line to the first input node, second impedance means including a fourth field effect transistor of the depletion type connecting the second bit line to the second input node, means for connecting the gates of said third and fourth transistors to said latch node, latch node control means for maintaining a precharge on the latch node and then discharging the precharge on the latch node, and bit line precharge means for precharging the bit lines such that substantially the same precharge voltage level is on both first and second bit lines.

6. The memory device according to claim 5, further comprising a first and second capacitors for each column, one ends of the first and second capacitors being connected to the first and second input nodes respectively, and means for charging the other ends of the first and second capacitors after the initiation of discharge on the latch node.

7. A memory circuit comprising first and second bit lines, a plurality of memory cells coupled to said bit lines, first to third nodes, a first enhancement type field effect transistor connected between said first and third nodes with its source-drain path and having a gate coupled to said second node, a second enhancement type field effect transistor connected between said second and third nodes with its source-drain path and having a gate coupled to said first node, a first depletion type field effect transistor coupled between said first bit line and said first node with its source-drain path and having a gate coupled to said third node, a second depletion type field effect transistor coupled between said second bit line and said second node with its source-drain path and having a gate coupled to said third node, and control means for sequentially charging said third node and then discharging said third node.

8. A memory device comprising first and second bit lines, memory cells, a flip-flop having first and second cross-connected enhancement type field effect transistors which are connected between first and second junction points and a discharge control node, third and fourth depletion type field effect transistors connected between said flip-flop and said first and second bit lines and having gates connected to said discharge control node of said flip-flop, respectively, a first capacitor connected to said first junction point at its one end, a second capacitor connected to said second junction point at its one end, and means for operatively supplying the other ends of said first and second capacitors with a refresh signal.

9. The memory device according to claim 8, in which a threshold voltage of said third and fourth field effect transistors is a value of 0.2 to 1 volt in absolute value.

10. The memory device according to claim 8, further comprising a first bus line, a second bus line, a fifth field effect transistor coupled between said first bit line and said first bus line, a sixth field effect transistor coupled between said second bit line and said second bus line, and means for selectively enabling said fifth and sixth field effect transistors.

* * * * *

UNITED STATES PATENT AND TRADEMARK OFFICE
CERTIFICATE OF CORRECTION

PATENT NO. : 4,542,484

DATED : September 17, 1985

INVENTOR(S) : Hiroaki IKEDA

It is certified that error appears in the above-identified patent and that said Letters Patent is hereby corrected as shown below:

Column 1, Line 43, "of the transistor" should read --occupied by the transistors--

Column 3, Line 18, "enable signal sense amplifier having" should read --enable signal. Each sense amplifier has--

Line 22, "first effect" should read --first field effect--

Line 49, "BRIEF DESCRIPTION OF THE DRAWINGS" should be after line 54

UNITED STATES PATENT AND TRADEMARK OFFICE
CERTIFICATE OF CORRECTION

PATENT NO. : 4,542,484
DATED     : September 17, 1985
INVENTOR(S) : Hiroaki IKEDA It is certified that error appears in the above-identified patent and that said Letters Patent is hereby corrected as shown below:

Column 4, Line 37, "Interchange" should read --Intercharge--

Line 44, "present" should read --preset--

Signed and Sealed this

Eighteenth Day of November, 1986

Attest:

DONALD J. QUIGG

*Attesting Officer*    *Commissioner of Patents and Trademarks*